(12) United States Patent
Apalkov et al.

(10) Patent No.: US 8,456,882 B2
(45) Date of Patent: *Jun. 4, 2013

(54) METHOD AND SYSTEM FOR PROVIDING DUAL MAGNETIC TUNNELING JUNCTIONS USABLE IN SPIN TRANSFER TORQUE MAGNETIC MEMORIES

(75) Inventors: Dmytro Apalkov, San Jose, CA (US); Vladimir Nikitin, Campbell, CA (US); David Druist, Santa Clara (CA); Steven M. Watts, Mountain View, CA (US)

(73) Assignee: Grandis, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/415,261

(22) Filed: Mar. 8, 2012

(65) Prior Publication Data

US 2012/0170362 A1 Jul. 5, 2012

Related U.S. Application Data

(63) Continuation of application No. 12/609,764, filed on Oct. 30, 2009, now Pat. No. 8,159,866.

(51) Int. Cl.
*G11C 5/08* (2006.01)
*G11C 11/06* (2006.01)
*G11C 11/14* (2006.01)
*G11C 11/15* (2006.01)

(52) U.S. Cl.
USPC ............... 365/66; 365/55; 365/158; 365/171; 365/173

(58) Field of Classification Search
USPC ............... 365/158, 171, 173, 55, 66
See application file for complete search history.

(56) References Cited

U.S. PATENT DOCUMENTS

| 6,532,164 | B2 | 3/2003 | Redon et al. |
| 6,611,405 | B1 | 8/2003 | Inomata et al. |
| 6,771,534 | B2 | 8/2004 | Stipe |
| 7,101,600 | B1 | 9/2006 | Kim |
| 7,630,234 | B2 | 12/2009 | Sugibayashi et al. |

(Continued)

FOREIGN PATENT DOCUMENTS

JP 11-120758 4/1999

OTHER PUBLICATIONS

Albert, et al., "Polarized Current Switching of a CO Thin Film Nanomagnet," American Institute of Physics, 77 (23):3809-11, Dec. 4, 2000.

(Continued)

*Primary Examiner* — Ly D Pham
(74) *Attorney, Agent, or Firm* — Convergent Law Group LLP

(57) ABSTRACT

A method and system for providing a magnetic junction usable in a magnetic memory are described. The magnetic junction includes first and second pinned layers, first and second nonmagnetic spacer layers, and a free layer. The first pinned layer has a first pinned layer magnetic moment and is nonmagnetic layer-free. The first nonmagnetic spacer layer resides between the first pinned and free layers. The free layer resides between the first and second nonmagnetic spacer layers. The second pinned layer has a second pinned layer magnetic moment and is nonmagnetic layer-free. The second nonmagnetic spacer layer resides between the free and second pinned layers. The first and second pinned layer magnetic moments are antiferromagnetically coupled and self-pinned. The magnetic junction is configured to allow the free layer to be switched between stable magnetic states when a write current is passed through the magnetic junction.

16 Claims, 6 Drawing Sheets

U.S. PATENT DOCUMENTS

| | | | |
|---|---|---|---|
| 8,159,866 | B2 * | 4/2012 | Apalkov et al. ............... 365/158 |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2003/0227807 | A1 | 12/2003 | Nakamura et al. |
| 2005/0040433 | A1 | 2/2005 | Nozieres et al. |
| 2005/0042367 | A1 | 2/2005 | Nemoto et al. |
| 2005/0068683 | A1 * | 3/2005 | Gill ............................. 360/314 |
| 2005/0068684 | A1 * | 3/2005 | Gill ............................. 360/314 |
| 2005/0104101 | A1 | 5/2005 | Sun et al. |
| 2005/0174702 | A1 | 8/2005 | Gill |
| 2007/0297102 | A1 | 12/2007 | Gill |

OTHER PUBLICATIONS

Berger, "Emission of spin waves by a magnetic multilayer traversed by a current," Physical Review B, 54(13) 9953-58 (1996).

Katine, et al., "Current-Driven Magnetization Reversal and Spin-Wave Excitations in Co/Cu/Co Pillars," Physical Review Letters, 84(14):3149-52, Apr. 3, 2000.

Nishimura, et al., "Magnetic tunnel junction device with perpendicular magnetizastion films for high-density magnetic random access memory," J. of Applied Physics, 90(8):5246-49 (2002).

Slonczewski, "Conductance and exchange coupling of two ferromagnets separated by a tunneling barrier, " The American Pysical Society, 39(10):6995-7002, Apr. 1, 1999.

Slonczewski, "Current-driven excitation of magnetic multilayers," J. of Magnetism and Magnetic Materials, 159:L1-Lz, 1.1-1.7, 1996.

Slonczewski, "Theory and Application of Exchange-Driven Switching," IEEE, pp. CE-02, Apr. 2000.

PCT International Search Report and Written Opinion of the ISA, application No. PCT/US08/64794.

PCT International Search Report and Written Opinion of the ISA, application No. PCT/US08/66369.

PCT International Search Report and Written Opinion of the ISA, application No. PCT/US10/47941.

PCT International Search Report and Written Opinion of the ISA, application No. PCT/US10/59184.

Office Action issued Apr. 3, 2008 for U.S. Appl. No. 11/239,939.

Office Action issued Sep. 8, 2008 for U.S. Appl. No. 11/239,939.

Office Action issued Jan. 4, 2010 for U.S. Appl. No. 12/133,671.

Office Action issued Apr. 15, 2009 for U.S. Appl. No. 12/13,671.

Office Action issued Mar. 23, 2011 for U.S. Appl. No. 12/638,902.

* cited by examiner

METHOD AND SYSTEM FOR PROVIDING DUAL MAGNETIC TUNNELING JUNCTIONS USABLE IN SPIN TRANSFER TORQUE MAGNETIC MEMORIES

CROSS-REFERENCE TO RELATED APPLICATIONS

This application is a Continuation of co-pending U.S. patent application Ser. No. 12/609,764, filed Oct. 30, 2009, assigned to the assignee of the present application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction.

For example, FIG. 1 depicts a conventional dual magnetic tunneling junction (MTJ) 10 as it may be used in a conventional STT-RAM. The conventional dual MTJ 10 typically resides on a bottom contact 12, uses conventional seed layer(s) 13 and is under a top contact 16. The conventional dual MTJ 10 includes a conventional antiferromagnetic (AFM) layer 20, a first conventional pinned layer 30, a first conventional tunneling barrier layer 40, a conventional free layer 50, a second conventional tunneling barrier layer 60, a second conventional pinned layer 70, and a second conventional AFM layer 80.

Conventional contacts 12 and 16 are used in driving the current in a current-perpendicular-to-plane (CPP) direction, or along the z-axis as shown in FIG. 1. The conventional tunneling barrier layers 40 and 60 are nonmagnetic, insulating, and thin. For example, a one nanometer thick layer of MgO might be used for either conventional tunneling barrier 40 or 60. The conventional seed layer(s) 13 are typically utilized to aid in the growth of subsequent layers, such as the AFM layer 20, having a desired crystal structure.

The conventional free layer 50 has a changeable magnetic moment 51. Although depicted as a simple layer, the conventional free layer 50 may also include multiple layers. For example, the conventional free layer 50 may be a synthetic antiferromagnetic (SAF) layer including magnetic layers antiferromagnetically or ferromagnetically coupled through thin conductive layers, such as Ru. The free layer 50 is typically on the order of two to four nanometers in thickness.

The conventional pinned layers 30 and 70 shown are SAFs. Thus, the conventional pinned layer 30 includes ferromagnetic layers 32, 34 and 38 separated by nonmagnetic layers 33 and 36. The nonmagnetic layers 33 and 36 are typically Ru and approximately one Angstrom thick. The ferromagnetic layer 38 closer to the conventional free layer 50 is termed a reference layer 38 and is typically formed of 1-2 nanometers of CoFeB. The ferromagnetic layers 32 and 34 may be made of materials such as CoFe and are approximately each one to three nanometers thick. Similarly, the conventional pinned layer 70 includes ferromagnetic layers 72 and 76 separated by nonmagnetic layer 74. The nonmagnetic layer 74 is typically Ru. The ferromagnetic layer 72 closer to the conventional free layer 50 is termed a reference layer 72 and is formed of one to three nanometers of CoFeB. The ferromagnetic layer 76 is typically one to three nanometers of CoFe. Thus, the pinned layer 30 typically has a thickness of approximately five to eleven nanometers. The pinned layer 70 typically has a thickness of three to seven nanometers. In other conventional MTJs, the pinned layers 30 and 70 could be simple ferromagnetic layers. In such conventional MTJs, the nonmagnetic layers 33, 36 and 74, ferromagnetic layer 34, and reference layers 38 and 72 would be omitted.

The conventional AFM layers 20 and 80 are used to fix, or pin, the magnetic moments of the conventional pinned layers 30 and 70, respectively. For example, the conventional AFM layer 20 pins the magnetic moment 31 of the conventional ferromagnetic layer 32 in the direction shown. This pinning may be accomplished via an exchange interaction. Similarly, conventional AFM layer 80 pins the magnetic moment 77 of the conventional ferromagnetic layer 76 in the direction shown. The thickness of the conventional nonmagnetic layers 33 and 36 are set such that the magnetic moments 37, 35, and 31 of the reference layer 38 and ferromagnetic layers 34 and 32 are antiferromagnetically coupled. Similarly, the thickness of the conventional nonmagnetic layer 74 is set such that the magnetic moment 73 of the reference layer 72 is antiferromagnetically coupled to the magnetic moment 77 of the pinned layer 76. In order to sufficiently pin the magnetic moments 31 and 77, the AFM layers 20 and 80 are thick antiferromagnets. For example, the AFM layers 20 and 80 are formed of antiferromagnets such as PtMn and typically have thicknesses approximately fifteen to twenty nanometers.

Spin transfer torque may be used to write to the conventional MTJ dual 10. In particular, spin transfer torque rotates the magnetic moment 51 of the conventional free layer 50 to one of the two directions along its easy axis. When a write current is passed through the conventional MTJ 10 perpendicular to the plane of the layers, electrons may be spin polarized by transmission through or reflection from the conventional pinned layers 30 and 70. The spin transfer torque on the magnetic moment 51 of the conventional free layer 50 may be adequate to switch the conventional free layer 50 if a sufficient current is driven through the conventional MTJ 10. Therefore, the conventional free layer 50 may be written to the desired state. The conventional MTJ 10 may thus be used for data storage in an STT-RAM.

The conventional dual MTJ 10 may be desirable for use in STT-RAM because it has a lower switching current density and reduced asymmetry as compared to single-barrier MTJ. However, the magnetoresistance of the conventional dual MTJ 10 may be reduced. Further, given the thicknesses of the layers 20, 32, 33, 34, 36, 38, 40, 50, 60, 72, 74, 76, and 80, the conventional dual MTJ 10 may have a thickness on the order of fifty-five nanometers or more. As higher density memories are manufactured, the length and width of the conventional dual MTJ 10 are on the order of its thickness. For example, the conventional dual MTJ 10 might be an ellipse having fifty nanometer and one hundred and fifty nanometer long axes. In such an embodiment, the short axis of the conventional dual MTJ 10 is smaller than the thickness. Consequently, fabrication of the conventional dual MTJ 10 may become challenging at higher densities.

Accordingly, what is desired in an improved magnetic junction usable in higher density STT-RAM.

BRIEF SUMMARY OF THE INVENTION

A method and system for providing a magnetic junction usable in a magnetic memory are described. The magnetic junction includes a first pinned layer, a first nonmagnetic spacer layer, a free layer, a second nonmagnetic spacer layer, and a second pinned layer. The first pinned layer has a first pinned layer magnetic moment and is nonmagnetic layer free. The first nonmagnetic spacer layer resides between the first pinned layer and the free layer. The free layer resides between the first nonmagnetic spacer layer and the second nonmagnetic spacer layer. The second pinned layer has a second pinned layer magnetic moment and is nonmagnetic layer free. The second nonmagnetic spacer layer resides between the free layer and the second pinned layer. The first pinned layer magnetic moment and the second pinned layer magnetic moment are antiferromagnetically coupled and self-pinned. The magnetic junction is configured to allow the free layer to be switched between a plurality of stable magnetic states when a write current is passed through the magnetic junction.

DETAILED DESCRIPTION OF THE INVENTION

Figure 1:
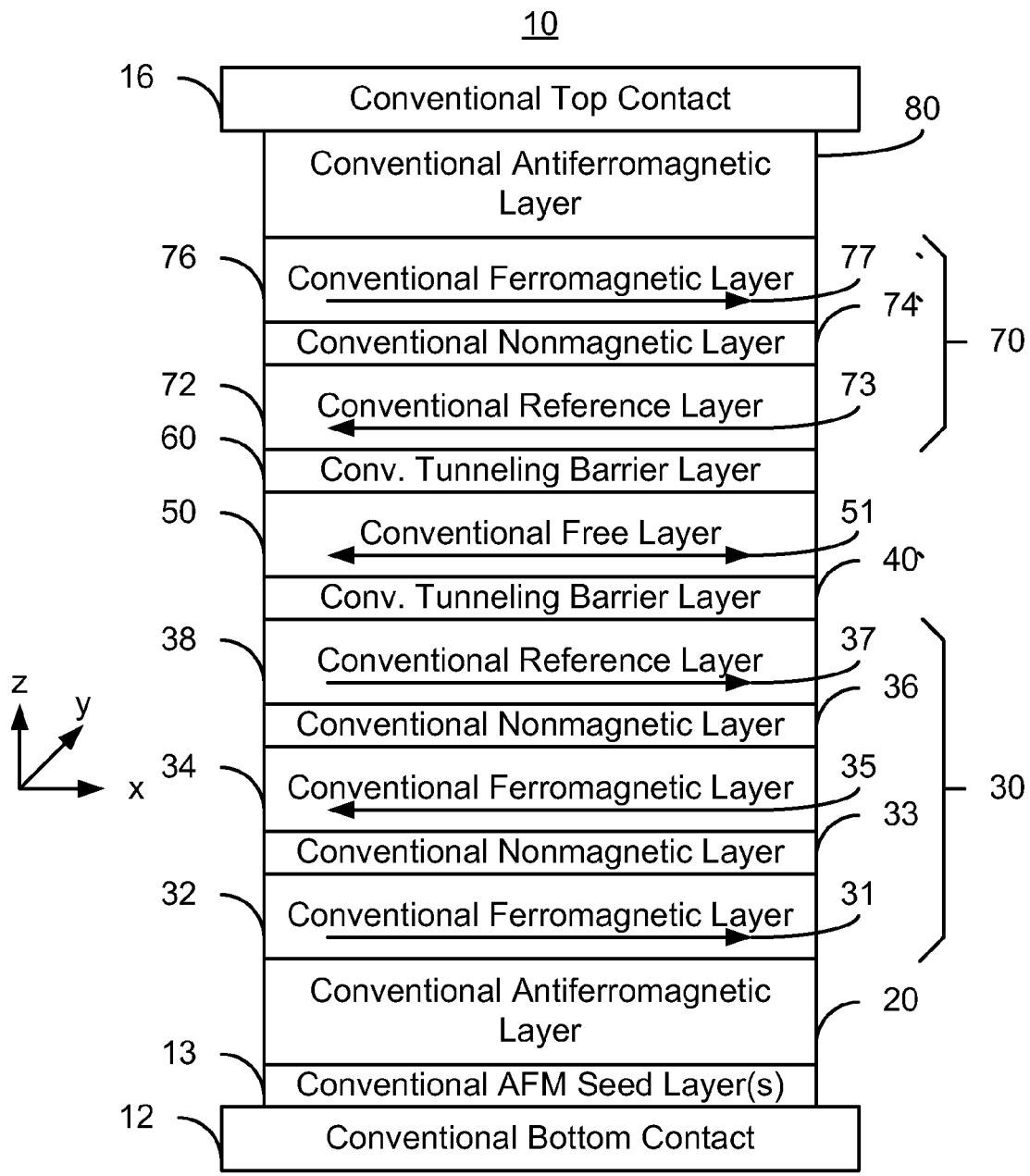
FIG. 1 depicts a conventional dual magnetic tunneling junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A method and system for providing a magnetic junction usable in a magnetic memory are described. The magnetic junction includes a first pinned layer, a first nonmagnetic spacer layer, a free layer, a second nonmagnetic spacer layer, and a second pinned layer. The first pinned layer has a first pinned layer magnetic moment and is nonmagnetic layer-free. The first nonmagnetic spacer layer resides between the first pinned layer and the free layer. The free layer resides between the first nonmagnetic spacer layer and the second nonmagnetic spacer layer. The second pinned layer has a second pinned layer magnetic moment and is nonmagnetic layer-free. The second nonmagnetic spacer layer resides between the free layer and the second pinned layer. The first pinned layer magnetic moment and the second pinned layer magnetic moment are antiferromagnetically coupled and self-pinned. The magnetic junction is configured to allow the free layer to be switched between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
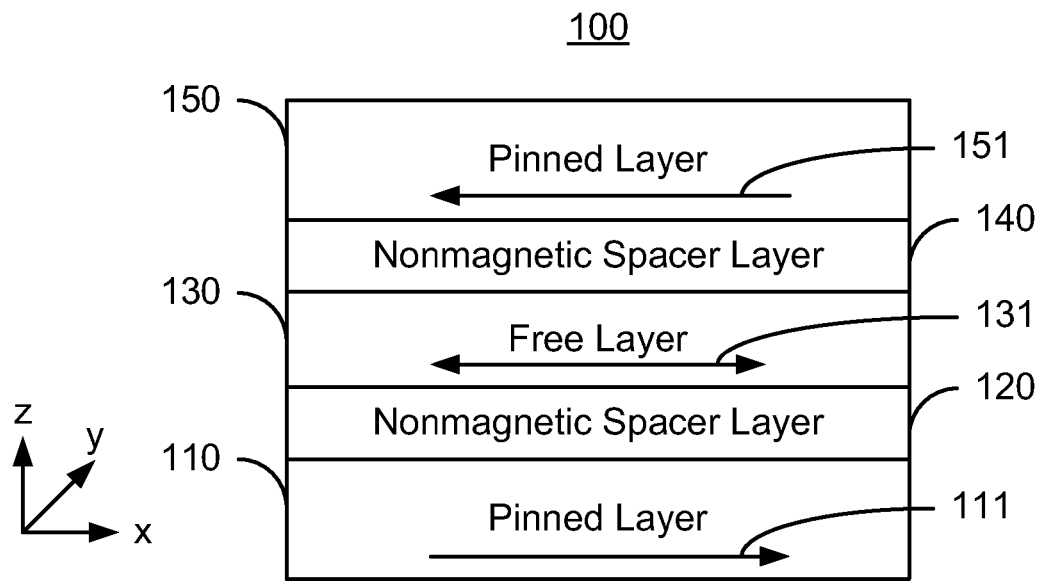
FIG. 2 depicts an exemplary embodiment of a dual magnetic junction suitable for use in a magnetic memory.

FIG. 2 depicts an exemplary embodiment of a dual magnetic junction 100 suitable for use in a magnetic memory. For example, the dual magnetic junction 100 may be used in magnetic memory in which current is to be driven through the magnetic junction 100 in a CPP direction. For clarity, FIG. 2 is not drawn to scale and some portions of the magnetic junction 100 might be omitted. The magnetic junction 100 includes a first pinned layer 110, a nonmagnetic spacer layer 120, a free layer 130, a second nonmagnetic spacer layer 140, and a second pinned layer 150. The magnetic junction 100 may also include seed layer(s) (not shown).

The spacer layers 120 and 140 are nonmagnetic. In some embodiments, the spacer layers 120 and/or 140 are insulating. For example, one or both of the spacer layers 120 and 140 may be a tunneling barrier layer. Such embodiments, the tunneling barrier layer may include crystalline MgO, which may enhance the tunneling magnetoresistance (TMR) of the dual magnetic junction 100. In alternate embodiments, the spacer layers 120 and 140 might have another structure, for example a granular layer including conductive channels in an insulating matrix.

The free layer 130 is a magnetic layer having a changeable magnetic moment 131. The magnetic moment 131 is shown as having arrows at both ends to indicate that the magnetic moment 131 may change direction. In some embodiments, the free layer 130 has a thickness of at least one nanometer and not more than ten nanometers. In some such embodiments, the free layer 130 thickness is at least one and a half and not more than five nanometers. Materials that may be used for the free layer 130 include CoFe, CoFeB, CoFeX, CoFeBX, where X may be Cr, V, Zr, Ta, Ni, and Ge. Although depicted as a simple layer with a single magnetic moment 131, the free layer 130 may also include multiple ferromagnetic and/or nonmagnetic layers. For example, the free layer 130 may be a SAF including magnetic layers antiferromagnetically or ferromagnetically coupled through one or more thin layers, such as Ru. The free layer 130 may also be a bilayer in which one or both sublayers are magnetic. Similarly, the free layer 130 might be a trilayer in which one or more sublayers are magnetic. In addition, the bilayer and/or trilayer might be repeated in the free layer 130. Other structures for the free layer 130 may also be used. However, in general, the free layer 130 is a simple, single layer.

In the embodiment shown, the free layer 130 has an easy axis along the magnetic moment 131. The free layer easy axis is, therefore, parallel to the x-axis, in the plane of the free layer 130. The magnetic moment of the free layer 130 is stable along the easy axis, to the left or to the right in FIG. 2. Thus, the stable magnetic states are those in which the magnetic moment 131 of the free layer 130 is to the left or right in FIG. 2. However, in another embodiment, the stable states might have the free layer magnetic moment 131 in another direction. In some embodiments, for example, at least a component of the free layer magnetic moment 131 may be in the z direction. The magnetic junction 100 is also configured to allow the free layer 130 to be switched between stable magnetic states when a write current is passed through the magnetic junction 100. Thus, in the exemplary embodiment depicted in FIG. 2, spin transfer torque may be used to switch the magnetic moment 131 of the free layer 130 to be parallel or antiparallel to the magnetic moment 111 of the pinned layer 110.

The pinned layers 110 and 150 are magnetic and thus may include one or more of Ni, Fe, and Co, particularly in an alloy form. Materials that may be used for the pinned layers 110 and 150 include CoFe, CoFeB, CoFeX, CoFeBX, where X may be Cr, V, Zr, Ta, Ni, and Ge. In some embodiments, the pinned layers 110 and 150 each has a thickness of at least one nanometer and not more than ten nanometers. In some such embodiments, each of the pinned layers 110 and 150 has a thickness of at least one and a half and not more than five nanometers. The pinned layers 110 and 150 shown are simple layers, consisting of a single magnetic layer. Although depicted as a simple layer with a single magnetic moment 111, the pinned layer 110 may include multiple layers. However, all of the layer(s) in the pinned layer 110 are magnetic. Stated differently, the pinned layer 110 is nonmagnetic layer-free. Although the pinned layer 110 may include nonmagnetic material(s), any nonmagnetic materials would be incorporated into an alloy and not form a separate layer. For example, the pinned layer 110 may be an alloy of CoFeB, but would not include a separate B layer. Similarly, the pinned layer 150 may be a single magnetic layer or may include multiple magnetic layers. However, the pinned layer 150 is also nonmagnetic layer-free. Thus, although nonmagnetic material(s) may be included in the magnetic layer(s) and/or alloy(s) forming the pinned layers 110 and 150, the nonmagnetic material(s) do not form separate layer(s) within the pinned layers 110 and 150, respectively.

In addition to being nonmagnetic layer-free, the pinned layers 110 and 150 are also self-pinned and antiferromagnetically coupled. More specifically, the pinned layer magnetic moment 111 is dipole coupled with the pinned layer magnetic moment 151 such that the magnetic moments 111 and 151 are antiferromagnetically coupled. As a result, the magnetic moments 111 and 151 are stable when aligned substantially antiparallel. In addition to be antiferromagnetically coupled, the magnetic moments 111 and 151 of the pinned layers 110 and 150, respectively, are also self-pinned. Self-pinning means that the magnetic moments 111 and 151 are fixed, or pinned, in their stable states during normal operation of the dual magnetic junction 100 due to their own geometry and/or interaction. The magnetic moments 111 and 151 are self-pinned due to their antiferromagnetic coupling, described above, in addition to their magnetic moment and coercivity. In addition to being dipole coupled, the pinned layers 110 and 150 have a sufficient thickness and magnetic moment such that the magnetic moments 111 and 151, respectively, are thermally stable and such that their magnetic coupling allows the magnetic moments 111 and 151 to be stable over the field(s) and other conditions to which the pinned layers 110 and 150 are exposed once the directions of the magnetic moments 111 and 151 are set. For example, in some embodiments, the pinned layers 110 and 150 may be made of materials such as CoFe and/or CoFeB and have thicknesses on the order of at least two and not more than three nanometers. In other embodiments, other thicknesses and/or other materials may be used.

In the embodiment shown, the magnetic moments 111 and 151 are parallel to the x-axis, in the plane of the pinned layers 110 and 150, respectively. However, in another embodiment, the stable states might have the magnetic moments 111 and 151 in another direction. In some embodiments, for example, at least a component of the layer magnetic moments 111 and 151 may be in the z direction. In some embodiments, the easy axes of the pinned layers 110 and 151 are parallel to the x-axis, along the magnetic moments 111 and 151 shown in FIG. 2. However, the antiferromagnetic coupling between the pinned layers 110 and 150 may be such that the magnetic moments 111 and 151 may be angled away from the easy axis. For example, the magnetic moments 111 and 151 may lie partly out of plane. In such embodiments, the magnetic moments 111 and 151 of the pinned layers 110 and 150 are also partially in the z-direction. For example, the angles of each of magnetic moments 111 and 151 may be greater than zero but not more than two degrees from the easy axis. In some such embodiments, the magnetic moments 111 and/or 151 may be at least one but not more than ten degrees from the easy axis. In other embodiments, other angles may be used.

The dual magnetic junction 100 may have improved performance and be more suitable for use at higher memory densities. Use of two pinned layers 110 and 150 having their magnetic moments 111 and 151, respectively, antiferromagnetically coupled allows for a higher tunneling magnetoresistance in combination with a reduced spin transfer switching current density. Because they are antiferromagnetically coupled, magnetic moments 111 and 151 of the pinned layers 110 and 150, respectively, are oriented substantially antiparallel. Consequently, the magnetostatic coupling of the free layer 130 to the pinned layers 110 and 150 is substantially eliminated. As a result, the free layer 130 is free to change between stable magnetic states through the use of spin transfer. Further, to the extent that the free layer magnetic moment 131 is canted from the easy axis, as described above, switching is facilitated. This is because the initial spin transfer torque on such a free layer magnetic moment 131 is nonzero. As a result, switching may actually be facilitated. The pinned layers 110 and 150 are also self-pinned and nonmagnetic layer-free. Consequently, the dual magnetic junction 100 is free of AFM layers. The pinned layers 110 and 150 are also free of nonmagnetic layers, such as Ru. The dual magnetic junction 100 may, therefore, be made thinner than the conventional dual MTJ 10. For example, in some embodiments, the dual magnetic junction 100 may be not more than twenty nanometers thick. In other embodiments, the dual magnetic junction 100 may be not more than fifteen nanometers thick. In other embodiments, the dual magnetic junction 100 may be not more than eleven nanometers thick. Further, the dual magnetic junction 100 may be not more than ten nanometers thick. Because the dual magnetic junction 100 may be made thinner, fabrication at smaller sizes in the x-y plane may be achieved. The dual magnetic junction 100 may thus be suitable for high density memories. The thinner structure may also allow for better control of the roughness of the layers 110, 120, 130, 140, and 150. Thus, lower RA (Resistance-Area product) structures may be more easily obtained. Further, the absence of nonmagnetic layers, such as Ru, in the pinned layers 110 and 150 in conjunction with the lack of AFM layers allows the dual magnetic junction 100 to be annealed at higher temperatures. For example, during fabrication, the dual magnetic junction 100 may be annealed at temperatures greater than three hundred fifty degrees Celsius. In some embodiments, the dual magnetic junction 100 may be annealed at temperatures of four hundred and fifty degrees or higher. In other embodiments, the annealing temperature may be up to five hundred degrees Celsius. Annealing at such higher temperatures, may improve the magnetoresistance, particularly for nonmagnetic spacer layers 120 and 140 formed of crystalline MgO. Further, because there are no AFM layers, high field annealing may be unnecessary. As a result, specialized annealing ovens may not be required. Fabrication of the dual magnetic junction 100 may thus be faster and lower in cost. Further, because AFM layers are superfluous, other seed layers might be used for the dual magnetic junction 100. These seed layers may be optimized for growth of the pinned layer 110, rather than for an AFM layer. Consequently, a higher quality pinned layer 110 may be obtained. Thus, fabrication and performance of a memory or other device incorporating the dual magnetic junction 100 may be improved.

Figure 3:
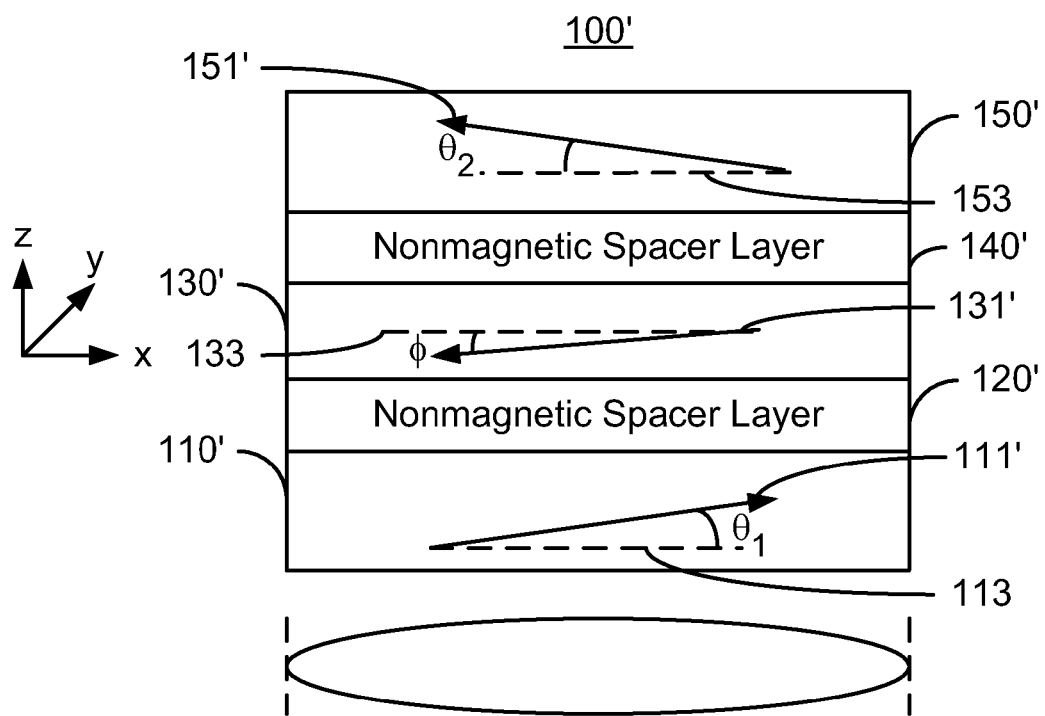
FIG. 3 depicts another exemplary embodiment of a dual magnetic junction suitable for use in a magnetic memory.

FIG. 3 depicts another exemplary embodiment of a dual magnetic junction 100' suitable for use in a magnetic memory. For clarity, FIG. 3 is not drawn to scale and some portions of the magnetic junction 100' might be omitted. The dual magnetic junction 100' is analogous to the dual magnetic junction 100 depicted in FIG. 2. Thus, the magnetic junction 100' includes a first pinned layer 110', a nonmagnetic spacer layer 120', a free layer 130', a second nonmagnetic spacer layer 140', and a second pinned layer 150' corresponding to the pinned layer 110, the nonmagnetic spacer layer 120, the free layer 130, the second nonmagnetic spacer layer 140, and the second pinned layer 150, respectively. The magnetic junction 100' may also include seed layer(s) (not shown). The thicknesses, materials, and functions of the layers 110', 120', 130', 140', and 150' are analogous to those of the layers 110, 120, 130, 140, and 150, respectively. Thus, nonmagnetic spacer layers 120' and 140' are nonmagnetic, may be tunneling barrier layers, and may include or consist of crystalline MgO. Similarly, the free layer 130' is magnetic and configured to switch between stable magnetic states when the appropriate write current is driven through the dual magnetic junction 100'. The pinned layers 110' and 150' are nonmagnetic layer-free, self-pinned, and have their magnetic moments 111' and 151' antiferromagnetically coupled. Thus, although the pinned layers 110' and 150' may include nonmagnetic materials, neither has a separate nonmagnetic layer therein. The magnetic moments 111' and 151' are antiferromagnetically coupled, thermally stable at the operating temperatures, and have a sufficiently large moment and coercivity such that the antiferromagnetic coupling allows the pinned magnetic moments to be stable over the magnetic fields and other conditions the dual magnetic junction 100' is exposed to during operation.

FIG. 3 more clearly depicts an embodiment in which the magnetic moments are canted. The easy axis 113 of the pinned layer 110', the easy axis 153 of the pinned layer 150', and the easy axis 133 of the free layer 130' are parallel to the x-direction in the embodiment shown. For example, the dual magnetic junction 100' may have an elliptical cross-section in the x-y plane. The long axis of the ellipse may be in the x-direction, resulting in the easy axes 113, 133 and 153 being in this direction.

Although the easy axes 113 and 153 are parallel to the x-direction, the magnetic moments 111' and 151' are not. Instead, the combination of the shape anisotropy resulting in the easy axes 113 and 153 and the magnetic coupling between the pinned layers 110' and 150' results in the magnetic moments 111' and 151' having the orientation shown. The magnetic moment 111' is canted at an angle $\theta_1$ from the easy axis 113. Similarly, the magnetic moment 151' is canted at an angle $\theta_2$ from the easy axis 153. In some embodiments, the canting occurs mostly in the plane of the layers. However, though there could be a non-uniformity of the free layer magnetization along out-of-plane direction, such as out-of-plane canting at some portions of the free layer. In some embodiments, the angle $\theta_1$ is greater than zero degrees. In some such embodiments, the angle $\theta_1$ is also not more than approximately five degrees. In some such embodiments, the angle $\theta_1$ is not more than two degree. In other such embodiments, the angle $\theta_1$ is at least one degree not more than two degrees. Similarly, in some embodiments, the angle $\theta_2$ is greater than zero degrees. In some such embodiments, the angle $\theta_2$ is also not more than approximately five degrees. In some such embodiments, the angle $\theta_2$ is not more than two degree. In other such embodiments, the angle $\theta_2$ is at least one degree not more than two degrees. The angles $\theta_1$ and $\theta_2$ are shown as being substantially the same. However, in other embodiments, $\theta_1$ and $\theta_2$ may be different. For example, for different geometries, thicknesses of the pinned layers 110' and 150', different materials having different magnetic moments used in the pinned layers 110' and 150', may result in different orientations.

Because they are generally oriented antiparallel, the fields from the magnetic moments 111' and 151' generally cancel at the free layer 130'. More specifically, the fields in the x-direction substantially cancel at the free layer 130'. However, as can be seen in FIG. 3, when the magnetic moments 111' and 151' are canted, the magnetostatic field from the pinned layers 110' and 150' does not quite cancel at the free layer 130'. A portion of the fields from the pinned layer 110' and 150' add, resulting in a small nonzero field at the free layer 150'. In the embodiment shown, this field is in the −y direction. Consequently, the stable states of the magnetic moment 131' of the free layer 130' are also canted at an angle of $\phi$ away from the easy axis 133. Note that the angle $\phi$ may be different from both $\theta_1$ and $\theta_2$. In one embodiment, $\phi$ is greater than zero and not more than twenty degrees. In some such embodiments, $\phi$ is at least five degrees and not more than fifteen degrees. Thus, the free layer magnetic moment 131' may be angled away from the easy axis 133, for example lying partly out of plane. The magnetic junction 100' is also configured to allow the free layer 130' to be switched between stable magnetic states when a write current is passed through the magnetic junction 100'.

The dual magnetic junction 100' may have improved performance and be more suitable for use at higher memory densities. The benefits of the dual magnetic junction 100' are analogous to those for the dual magnetic junction 100. For example, a low switching current density, higher signal, low RA and other features may be achieved. Further, to the extent that the free layer magnetic moment 131' is canted from the easy axis 133' switching is facilitated. This is because the initial spin transfer torque on such a free layer magnetic moment 131' is nonzero. As a result, switching may actually be facilitated. Thus, the dual magnetic junction 100' may have improved performance.

Figure 4:
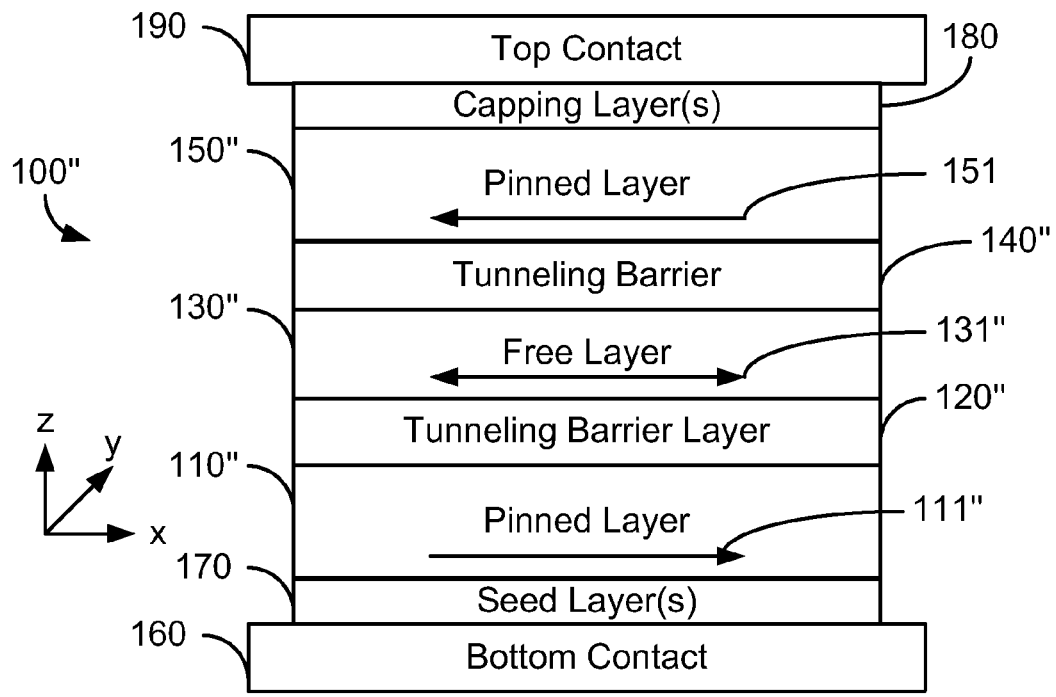
FIG. 4 depicts another exemplary embodiment of a dual magnetic junction suitable for use in a magnetic memory.

FIG. 4 depicts another exemplary embodiment of a dual magnetic junction 100" suitable for use in a magnetic memory. For clarity, FIG. 4 is not drawn to scale and some portions of the magnetic junction 100" might be omitted. The dual magnetic junction 100" is analogous to the dual magnetic junctions 100 and 100' depicted in FIGS. 2-3. Thus, the magnetic junction 100" includes a first pinned layer 110", a nonmagnetic spacer layer 120", a free layer 130", a second nonmagnetic spacer layer 140", and a second pinned layer 150" corresponding to the pinned layer 110/110', the nonmagnetic spacer layer 120/120', the free layer 130/130', the second nonmagnetic spacer layer 140/140', and the second pinned layer 150/150', respectively. The thicknesses, materials, and functions of the layers 110", 120", 130", 140", and 150" are analogous to those of the layers 110/110', 120/120', 130/130', 140/140', and 150/150', respectively. Thus, nonmagnetic spacer layers 120' and 140' are nonmagnetic, may be tunneling barrier layers, and may include or consist of crystalline MgO. Similarly, the free layer 130" is magnetic and configured to switch between stable magnetic states when the appropriate write current is driven through the dual magnetic junction 100". The pinned layers 110" and 150" are nonmagnetic layer-free, self-pinned, and have their magnetic moments 111" and 151" antiferromagnetically coupled. Thus, although the pinned layers 110" and 150" may include nonmagnetic materials, neither has a separate nonmagnetic layer therein. The magnetic moments 111" and 151" are antiferromagnetically coupled, thermally stable at the operating temperatures, and have a sufficiently large moment and coercivity such that the antiferromagnetic coupling allows the pinned magnetic moments to be stable over the magnetic fields and other conditions the dual magnetic junction 100" is exposed to during operation. Although the magnetic moments 111" and 151" are shown as aligned precisely antiparallel and along the x-axis, the magnetic moments 111" and 151" may be oriented in a manner analogous to magnetic moments 111' and 151' depicted in FIG. 3. Thus, the magnetic moments 111" and 151" may be canted from the easy axis of the pinned layers 110" and 150", respectively. Similarly, the free layer magnetic moments 131" is depicted as along the easy axis, parallel to the x-axis. However, the free layer magnetic moment 131" may be oriented in a manner analogous to the free layer magnetic moment 131' depicted in FIG. 3. Thus, the free layer magnetic moment 131" may be canted from the easy axis.

Also shown in FIG. 4 are a bottom contact 160, a seed layer(s) 170, capping layer(s) 180, and a top contact 190. Thus, the dual magnetic junction 100" is configured to be used in a CPP orientation. To change the magnetic moment of the free layer 131" between stable states (generally parallel or antiparallel to the x-axis), a write current may be driven from the bottom contact 160 to the top contact 190, or vice versa. In addition, optional seed layer(s) 170 may be used. The seed layer(s) 170 are configured to provide a desired surface for growth of the pinned layer 110". The capping layer(s) 180 are optional and may be used to protect the dual magnetic junction 100" from damage. However, in other embodiments, the capping layer(s) 180 may be omitted.

The dual magnetic junction 100" may have improved performance and be more suitable for use at higher memory densities. The benefits of the dual magnetic junction 100" are analogous to those for the dual magnetic junctions 100 and 100'. For example, a low switching current density, higher signal, low RA, improved switching due to a nonzero initial spin transfer torque and other features may be achieved. Further, to the extent that the free layer magnetic moment 131" is canted from the easy axis (not shown in FIG. 4) switching is facilitated. Further, the seed layer 170 may be configured specifically for the pinned layer 110". The crystal structure and, therefore, magnetic properties of the pinned layer 110" may be enhanced. Thus, the dual magnetic junction 100" may have improved performance.

Figure 5:
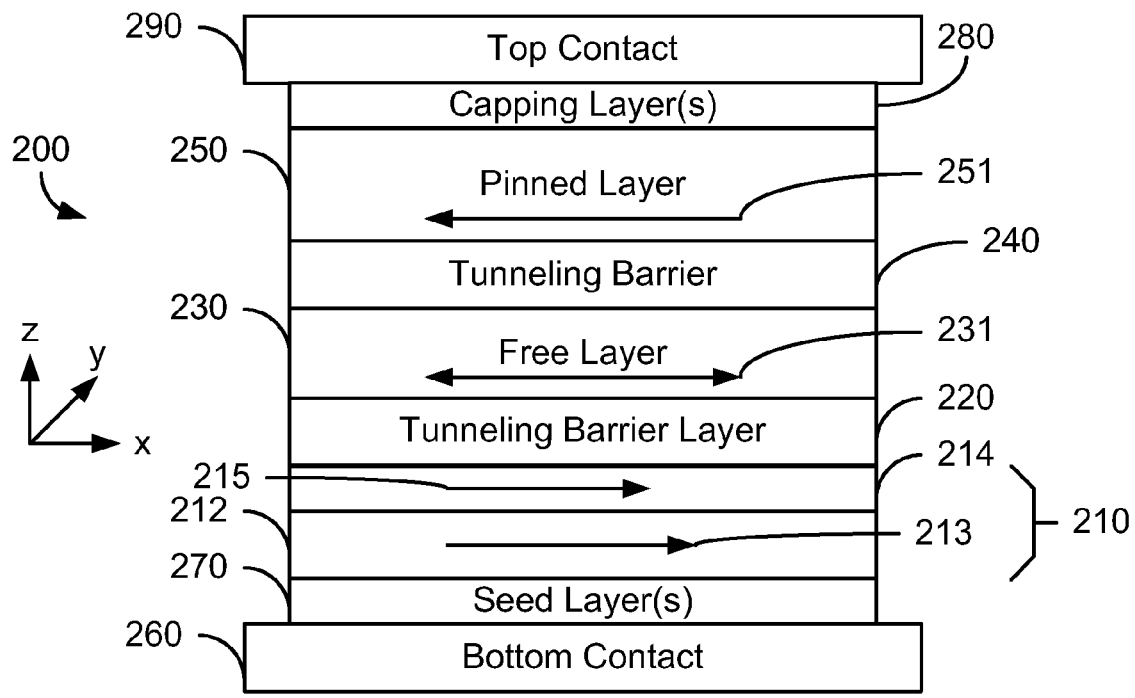
FIG. 5 depicts another exemplary embodiment of a dual magnetic junction suitable for use in a magnetic memory.

FIG. 5 depicts an alternate exemplary embodiment of a dual magnetic junction 200 suitable for use in a magnetic memory. For clarity, FIG. 5 is not drawn to scale and some portions of the dual magnetic junction 200 might be omitted. The dual magnetic junction 200 is analogous to the dual magnetic junctions 100, 100', and 100" depicted in FIGS. 2-4. Thus, the magnetic junction 200 includes a first pinned layer 210, a nonmagnetic spacer layer 220, a free layer 230, a second nonmagnetic spacer layer 240, and a second pinned layer 250 corresponding to the pinned layer 110/110'/110", the nonmagnetic spacer layer 120/120'/120", the free layer 130/130'/130", the second nonmagnetic spacer layer 140/140'/140", and the second pinned layer 150/150'/150", respectively. The thicknesses, materials, and functions of the layers 210, 220, 230, 240, and 250 are analogous to those of the layers 110/110'/110", 120/120'/120", 130/130'/130", 140/140'/140", and 150/150'/150", respectively. Thus, nonmagnetic spacer layers 220 and 240 are nonmagnetic, may be tunneling barrier layers, and may include or consist of crystalline MgO. Similarly, the free layer 230 is magnetic and configured to switch between stable magnetic states when the appropriate write current is driven through the dual magnetic junction 200. The pinned layers 210 and 250 are nonmagnetic layer-free, self-pinned, and have their magnetic moments 213/215 and 251 antiferromagnetically coupled. Thus, although the pinned layers 210 and 250 may include nonmagnetic materials, neither has a separate nonmagnetic layer therein. The magnetic moments 213/215 and 251 are antiferromagnetically coupled, thermally stable at the operating temperatures, and have a sufficiently large moment and coercivity such that the antiferromagnetic coupling allows the pinned magnetic moments to be stable over the magnetic fields and other conditions the dual magnetic junction 200 is exposed to during operation. Although the magnetic moments 213/215 and 251 are shown as aligned precisely antiparallel and along the x-axis, the magnetic moments 213/215 and 251 may be oriented in a manner analogous to the magnetic moments 111' and 151' depicted in FIG. 3. Thus, the magnetic moments 213/215 and 251 may be canted from the easy axis of the pinned layers 210 and 250, respectively. Similarly, the free layer magnetic moment 231 is depicted as along the easy axis, parallel to the x-axis. However, the free layer magnetic moment 231 may be oriented in a manner analogous to the free layer magnetic moment 131' depicted in FIG. 3. Thus, the free layer magnetic moment 231 may be canted from the easy axis. Also shown in FIG. 5 are a bottom contact 260, a seed layer(s) 270, capping layer(s) 280, and a top contact 290 analogous to the contact 160, seed layer(s) 170, capping layer(s) 180, and top contact 190 depicted in FIG. 4. Thus, the dual magnetic junction 200 is configured to be used in a CPP orientation. To change the magnetic moment of the free layer 231 between stable states (generally parallel or antiparallel to the x-axis), a write current may be driven from the bottom contact 260 to the top contact 290, or vice versa.

In the dual magnetic junction 200, the pinned layer 210 is depicted as including two adjoining magnetic layers 212 and 214 having magnetic moments 213 and 215. Thus, the pinned layer 210 is still nonmagnetic layer-free, antiferromagnetically coupled with the pinned layer 250, and self-pinned. However, instead of being a simple, single layer, the pinned layer 210 includes a multilayer consisting of ferromagnetic layers 212 and 214. The ferromagnetic layers 212 and 214 may be alloys and may include nonmagnetic materials. However, no separate nonmagnetic layer is present in the pinned layer 210. In another embodiment, the pinned layer 210 might include another number of ferromagnetic layers. However, the pinned layer 210 is still desired to be thin, for example on the order of at least two and not more than five nanometers.

The dual magnetic junction 200 may have improved performance and be more suitable for use at higher memory densities. The benefits of the dual magnetic junction 200 are analogous to those for the dual magnetic junctions 100, 100', and 100". For example, a low switching current density, higher signal, low RA, improved switching due to a nonzero initial spin transfer torque and other features may be achieved. Further, to the extent that the free layer magnetic moment 231 is canted from the easy axis of the free layer 230, switching is facilitated. Thus, the dual magnetic junction 200 may have improved performance.

Figure 6:
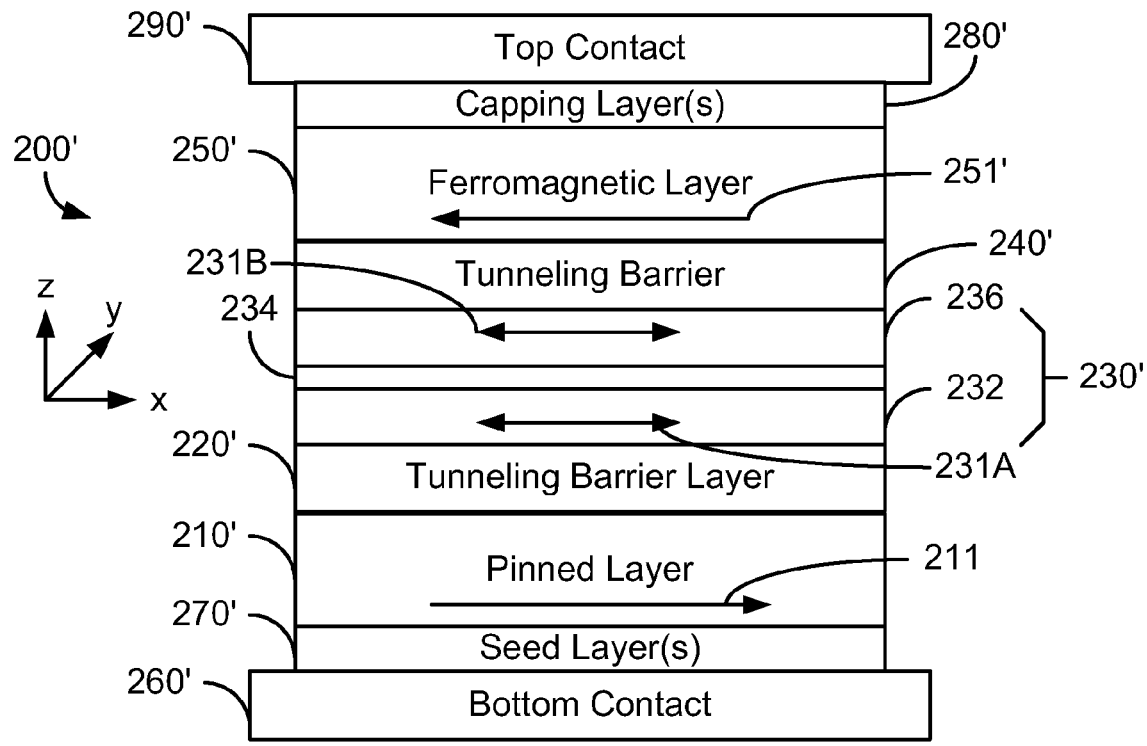
FIG. 6 depicts another exemplary embodiment of a dual magnetic junction suitable for use in a magnetic memory.

FIG. 6 depicts an alternate exemplary embodiment of a dual magnetic junction 200' suitable for use in a magnetic memory. For clarity, FIG. 6 is not drawn to scale and some portions of the dual magnetic junction 200' might be omitted. The dual magnetic junction 200' is analogous to the dual magnetic junctions 100, 100', 100", and 200 depicted in FIGS. 2-45. Thus, the magnetic junction 200' includes a first pinned layer 210', a nonmagnetic spacer layer 220', a free layer 230', a second nonmagnetic spacer layer 240', and a second pinned layer 250' corresponding to the pinned layer 110/110'/110"/210, the nonmagnetic spacer layer 120/120'/120"/220, the free layer 130/130'/130"/230, the second nonmagnetic spacer layer 140/140'/140"/240, and the second pinned layer 150/150'/150"/250, respectively. The thicknesses, materials, and functions of the layers 210', 220', 230', 240', 250', 260', 270', 280', and 290' are analogous to those of the layers 110/110'/110"/210, 120/120'/120"/220, 130/130'/130"/230, 140/140'/140"/240, 150/150'/150"/250, 160/260, 170/270, 180/280, and 190/290, respectively. Thus, nonmagnetic spacer layers 220' and 240' are nonmagnetic, may be tunneling barrier layers, and may include or consist of crystalline MgO. Similarly, the free layer 230' is magnetic and configured to switch between stable magnetic states when the appropriate write current is driven through the dual magnetic junction 200'. The pinned layers 210' and 250' are nonmagnetic layer-free, self-pinned, and have their magnetic moments 211 and 251' antiferromagnetically coupled. Thus, although the pinned layers 210' and 250' may include nonmagnetic materials, neither has a separate nonmagnetic layer therein. The magnetic moments 211 and 251' are antiferromagnetically coupled, thermally stable at the operating temperatures, and have a sufficiently large moment and coercivity such that the antiferromagnetic coupling allows the pinned magnetic moments to be stable over the magnetic fields and other conditions the dual magnetic junction 200' is exposed to during operation. Although the magnetic moments 211 and 251' are shown as aligned precisely antiparallel and along the x-axis, the magnetic moments 211 and 251' may be oriented in a manner analogous to the magnetic moments 111' and 151' depicted in FIG. 3. Thus, the magnetic moments 211 and 251' may be canted from the easy axis of the pinned layers 210' and 250', respectively. Similarly, the free layer magnetic moments 231A and 231B are depicted as along the easy axis, parallel to the x-axis. However, the free layer magnetic moments 231A and 231B are may be oriented in a manner analogous to the free layer magnetic moment 131' depicted in FIG. 3. Thus, the free layer magnetic moments 231A and 231B are may be canted from the easy axis. To change the magnetic moments 231A and 231B of the free layer 230' between stable states (generally parallel or antiparallel to the x-axis), a write current may be driven from the bottom contact 260' to the top contact 290', or vice versa.

In the dual magnetic junction 200', the free layer 230' is depicted as including two magnetic layers 232 and 236 separated by a nonmagnetic layer 234. Thus, the free layer 230' shown is a SAF. In other embodiments, the nonmagnetic layer 234 may be omitted. In such embodiments, the ferromagnetic layers 232 and 236 may be ferromagnetically coupled. Thus, instead of being a simple, single layer, the free layer 230' is a multilayer. In another embodiment, the free layer 230' might include another number of ferromagnetic layers and/or nonmagnetic layers.

The dual magnetic junction 200' may have improved performance and be more suitable for use at higher memory densities. The benefits of the dual magnetic junction 200' are analogous to those for the dual magnetic junctions 100, 100', 100", and 200. For example, a low switching current density, higher signal, low RA, improved switching due to a nonzero initial spin transfer torque and other features may be achieved. Further, to the extent that the free layer magnetic moment is canted from the easy axis of the free layer 230', switching is facilitated. Thus, the dual magnetic junction 200' may have improved performance.

Figure 7:
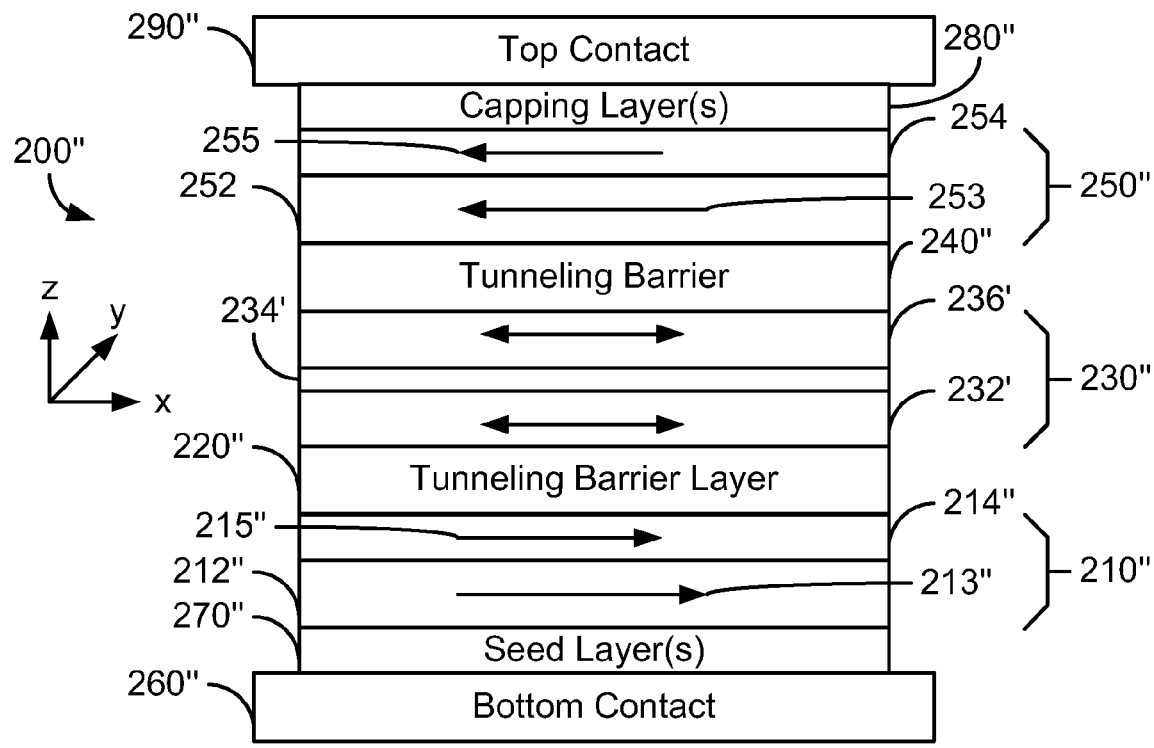
FIG. 7 depicts another exemplary embodiment of a dual magnetic junction suitable for use in a magnetic memory.

FIG. 7 depicts another exemplary embodiment of a dual magnetic junction 200" suitable for use in a magnetic memory. For clarity, FIG. 7 is not drawn to scale and some portions of the dual magnetic junction 200" might be omitted. The dual magnetic junction 200" is analogous to the dual magnetic junctions 100, 100', 100", 200, and 200' depicted in FIGS. 2-6. Thus, the magnetic junction 200" includes a first pinned layer 210", a nonmagnetic spacer layer 220", a free layer 230", a second nonmagnetic spacer layer 240", and a second pinned layer 250" corresponding to the pinned layer 110/110'/110"/210/210', the nonmagnetic spacer layer 120/120'/120"/220/220', the free layer 130/130'/130"/230/230', the second nonmagnetic spacer layer 140/140'/140"/240/240', and the second pinned layer 150/150'/150"/250/250', respectively. The thicknesses, materials, and functions of the layers 210", 220", 230", 240", 250", 260", 270", 280", and 290" are analogous to those of the layers 110/110'/110"/210/210', 120/120'/120"/220/220', 130/130'/130"/230/230', 140/140'/140"/240/240', 150/150'/150"/250/250', 160/260/260', 170/270/270', 180/280/280', and 190/290/290', respectively. Thus, nonmagnetic spacer layers 220" and 240" are nonmagnetic, may be tunneling barrier layers, and may include or consist of crystalline MgO. Similarly, the free layer 230" is magnetic and configured to switch between stable magnetic states when the appropriate write current is driven through the dual magnetic junction 200". The pinned layers 210" and 250" are nonmagnetic layer-free, self-pinned, and have their magnetic moments 213"/215" and 253/255 antiferromagnetically coupled. Thus, although the pinned layers 210" and 250" may include nonmagnetic materials, neither has a separate nonmagnetic layer therein. The magnetic moments 213"/215" and 253/255 are antiferromagnetically coupled, thermally stable at the operating temperatures, and have a sufficiently large moment and coercivity such that the antiferromagnetic coupling allows the pinned magnetic moments to be stable over the magnetic fields and other conditions the dual magnetic junction 200" is exposed to during operation. Although the magnetic moments 213"/215" and 253/255 are shown as aligned precisely antiparallel and along the x-axis, the magnetic moments 213"/215" and 253/255 may be oriented in a manner analogous to the magnetic moments 111' and 151' depicted in FIG. 3. Thus, the magnetic moments 213"/215" and 253/255 may be canted from the easy axis of the pinned layers 210" and 250", respectively. Similarly, the free layer magnetic moments are depicted as along the easy axis, parallel to the x-axis. However, the free layer magnetic moments may be oriented in a manner analogous to the free layer magnetic moment 131' depicted in FIG. 3. Thus, the free layer magnetic moments may be canted from the easy axis. To change the magnetic moments of the free layer 230" between stable states (generally parallel or antiparallel to the x-axis), a write current may be driven from the bottom contact 260" to the top contact 290", or vice versa.

In the dual magnetic junction 200", the free layer 230" is depicted as including two magnetic layers 232' and 236' separated by a nonmagnetic layer 234'. Thus, the free layer 230" is analogous to the free layer 230'. Thus, instead of being a simple, single layer, the free layer 230" is a multilayer. In another embodiment, the free layer 230" might include another number of ferromagnetic layers and/or nonmagnetic layers. Similarly, the pinned layers 210" and 250" each includes multiple ferromagnetic layers 212"/214" and 252/254. Although still self-pinned, antiferromagnetically coupled, and nonmagnetic layer-free, the pinned layers 210" and 250" are multilayers. However, each of the pinned layer 210" and 250" is still desired to be thin, for example on the order of at least two and not more than three nanometers.

The dual magnetic junction 200" may have improved performance and be more suitable for use at higher memory densities. The benefits of the dual magnetic junction 200" are analogous to those for the dual magnetic junctions 100, 100', 100", 200, and 200'. For example, a low switching current density, higher signal, low RA, improved switching due to a nonzero initial spin transfer torque and other features may be achieved. Further, to the extent that the free layer magnetic moment is canted from the easy axis of the free layer 230", switching is facilitated. Thus, the dual magnetic junction 200" may have improved performance.

Figure 8:
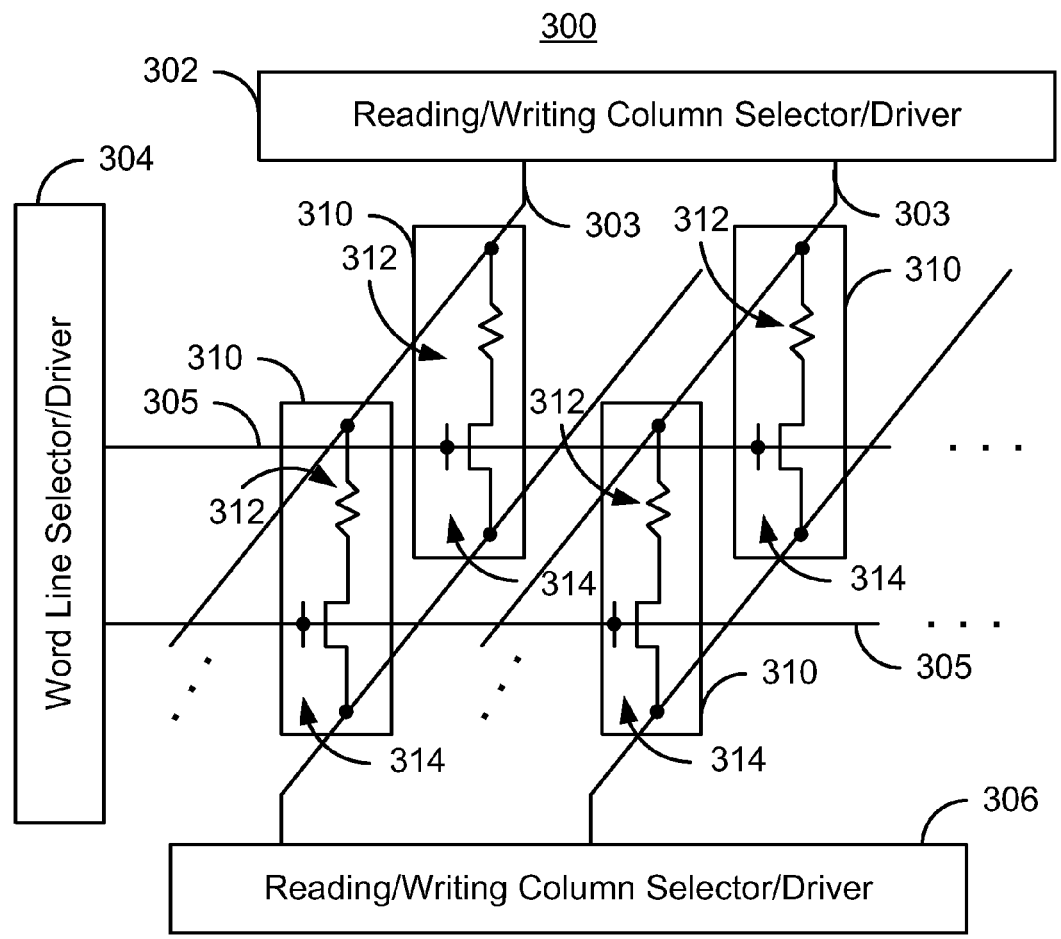
FIG. 8 depicts an exemplary embodiment of a magnetic memory utilizing a dual magnetic junction.

FIG. 8 depicts an exemplary embodiment of a magnetic memory 300 utilizing a dual magnetic junction. In the embodiment shown, the magnetic memory is a STT-RAM 300. The magnetic memory 300 includes reading/writing column selector/drivers 302 and 306 as well as word line selector/driver 304. The magnetic memory 300 also includes memory cells 310 including a magnetic junction 312 and a selection/isolation device 314. The magnetic junction 312 may be any magnetic junction 100/100'/100"/200/200'/200". The reading/writing column selector/drivers 302 and 306 may be used to selectively drive current through the bit lines 303 and thus the cells 310. The word line selector/driver 304 selectively enables row(s) of the magnetic memory 300 by enabling the selection/isolation device 314 coupled with the selected word line 305.

Because the magnetic memory 300 may use the magnetic junctions 100/100'/100"/200/200'/200", the magnetic memory 300 share the benefits of the magnetic junctions 100/100'/100"/200/200'/200". Consequently, performance of the magnetic memory 300 may be improved.

Figure 9:
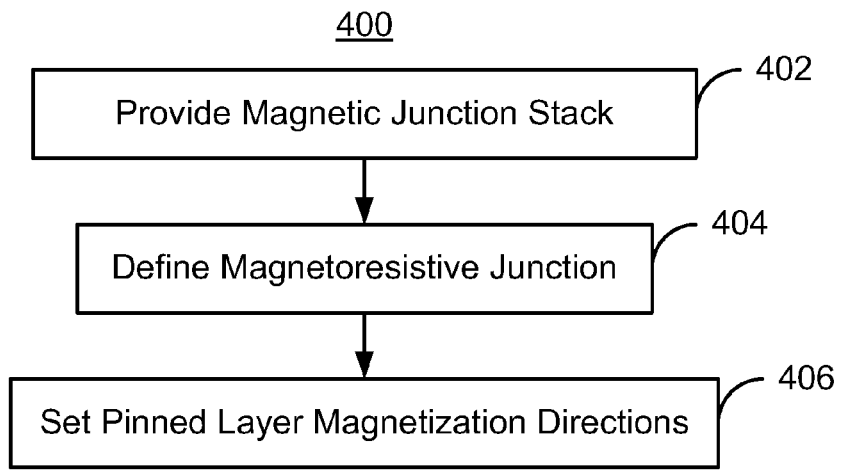
FIG. 9 depicts an exemplary embodiment of a method for fabricating dual magnetic tunneling junction suitable for use in a magnetic memory.

FIG. 9 depicts an exemplary embodiment of a method 400 for fabricating dual magnetic tunneling junction suitable for use in a magnetic memory. The method 400 is described in the context of the dual magnetic junctions 100/100'. However, the method 400 may also be used to fabricate other magnetic junctions. In addition, for simplicity, some steps may be omitted. In addition, the method 400 may combine and/or use additional and/or other steps. The method 400 is also described in the context of fabricating a single magnetic junction. However, the method 400 generally forms multiple magnetic junctions in parallel, for example for the memory 300.

A magnetic junction stack is provided, via step 402. The magnetic junction stack includes a first pinned layer film, a first nonmagnetic spacer layer film, a free layer film, a second nonmagnetic spacer film, and a second pinned layer film. The first pinned layer film is nonmagnetic layer-free and used to form the pinned layer 110/110'. The first nonmagnetic spacer layer film is between the first pinned layer film and the free layer film and is used to provide the nonmagnetic spacer 120/120'. The free film layer is between the first nonmagnetic spacer layer film and the second nonmagnetic spacer layer film. The free layer 130/130' is formed form the free layer film. The second nonmagnetic spacer layer film is used to form the nonmagnetic spacer layer 140/140'. The second nonmagnetic spacer layer film is between the free layer film and the second pinned layer film. The second pinned layer 150/150' is formed from the second pinned layer film. The second pinned layer film is also nonmagnetic layer-free. The first and second pinned layer films are separated by a sufficient distance that the first pinned layer 110/110' and the second pinned layer 150/150' may be antiferromagnetically coupled. In some embodiments, the magnetic junction stack may also be annealed in step 402. The annealing may be carried out at temperatures higher than three hundred and fifty degrees Celsius. In some embodiments, the annealing temperatures may be at least four hundred degrees. In some such embodiments, the annealing temperature is not more than five hundred degrees Celsius.

The magnetic junction 100/100' is defined from the magnetic junction stack, via step 404. Step 404 includes providing a mask that covers a portion of the magnetic junction stack, then removing the exposed portions of the magnetic junction stack. The magnetic junction 100/100' includes a first pinned layer 110/110' defined from the first pinned layer film, a first nonmagnetic spacer layer 120/120' defined from the first nonmagnetic spacer layer film, a free layer 130/130' defined from the free layer film, a second nonmagnetic spacer layer 140/140' defined from the second nonmagnetic spacer layer film, and a second pinned layer 150/150' defined from the second nonmagnetic spacer layer film.

The first pinned layer magnetization and the second pinned layer magnetization are set such that the first pinned layer magnetization 111/111' and the second pinned layer magnetization 151/151' are antiferromagnetically coupled and self-pinned, via step 406. For example, step 406 may be performed by applying a magnetic field to align the magnetic moments 111/111' and 151/151', then reducing the magnetic field such that one of the pinned layer magnetic moments 111/111' or 151/151' changes direction to be antiferromagnetically aligned with the other magnetic moment 151/151' or 111/111'.

Thus, the magnetic junction 100/100'/100"/200/200'/200" may be fabricated. A magnetic junction and/or the magnetic memory 300 fabricated using the magnetic junction fabricated through the method 400 shares the benefits of the magnetic junctions 100/100'/100"/200/200'/200" and/or the magnetic memory 300. Consequently, performance of the magnetic junctions 100/100'/100"/200/200'/200" and/or the magnetic memory 300 may be improved.

Figure 10:
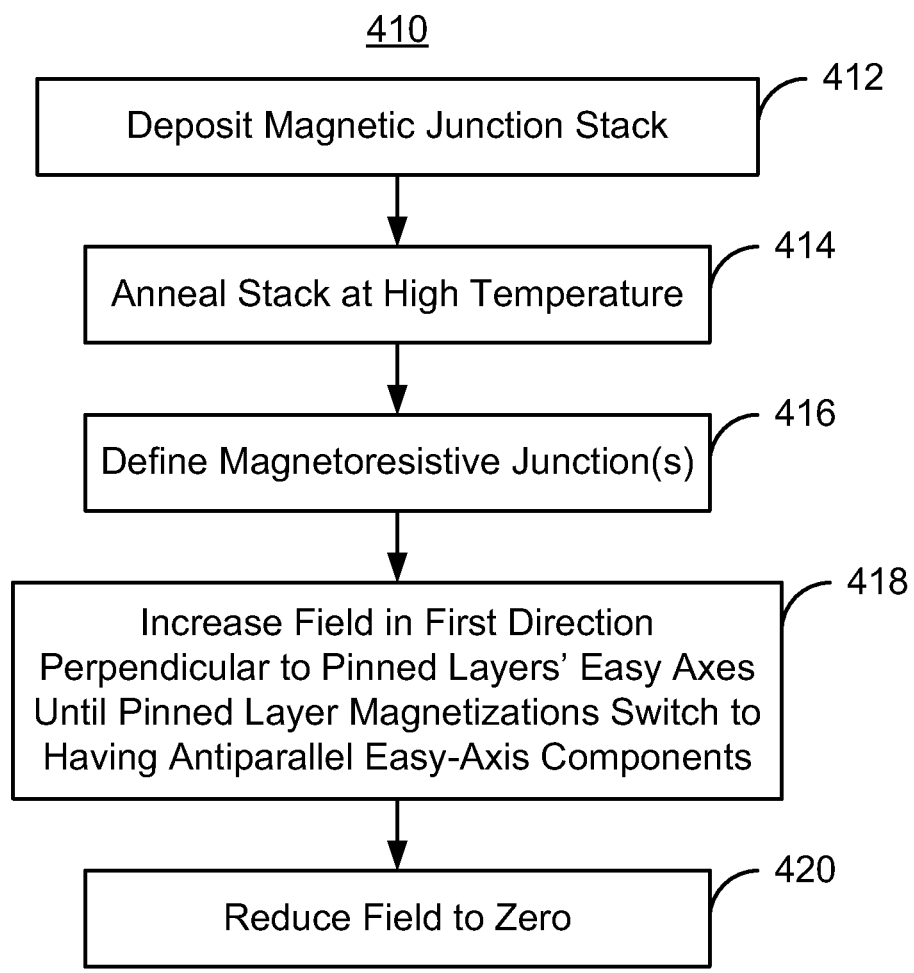
FIG. 10 depicts another exemplary embodiment of a method for fabricating dual magnetic tunneling junction suitable for use in a magnetic memory.

FIG. 10 depicts another exemplary embodiment of a method 410 for fabricating dual magnetic tunneling junction suitable for use in a magnetic memory. The method 410 is described in the context of the dual magnetic junctions 100/100'. However, the method 410 may also be used to fabricate other magnetic junctions. In addition, for simplicity, some steps may be omitted. In addition, the method 410 may combine and/or use additional and/or other steps. The method 410 is also described in the context of fabricating a single magnetic junction. However, the method 410 generally forms multiple magnetic junctions in parallel, for example for the memory 300.

A magnetic junction stack is deposited, via step 412. The magnetic junction stack includes a first pinned layer film, a first nonmagnetic spacer layer film, a free layer film, a second nonmagnetic spacer film, and a second pinned layer film. The first pinned layer film is nonmagnetic layer-free and used to form the pinned layer 110/110'. The first pinned layer film may thus be approximately one to five nanometers thick. The first nonmagnetic spacer layer film is between the first pinned layer film and the free layer film and is used to provide the nonmagnetic spacer 120/120'. The free layer film is between the first nonmagnetic spacer layer film and the second nonmagnetic spacer layer film. The free layer 130/130' is formed form the free layer film. The free layer is thermally stable at room temperature. Thus the free layer film may be approximately one to five nanometers thick. The second nonmagnetic spacer layer film is used to form the nonmagnetic spacer layer 140/140'. The second nonmagnetic spacer layer film is between the free layer film and the second pinned layer film. The first and second nonmagnetic spacer layer films may be tunneling barrier films. For example, crystalline MgO having a thickness of approximately one nanometer may be used.

The second pinned layer 150/150' is formed from the second pinned layer film. The second pinned layer film is also nonmagnetic layer-free. The second pinned layer film may also be approximately one to five nanometers thick. The first and second pinned layer films are separated by a sufficient distance that the first pinned layer 110/110' and the second pinned layer 150/150' may be antiferromagnetically coupled. In some embodiments, step 412 also includes depositing a seed layer for the first pinned layer film.

The magnetic junction stack is annealed at high temperature, via step 414. As used herein, a high temperature is above three hundred and fifty degrees Celsius. In some embodiments, the high annealing temperatures may be at least four hundred degrees Celsius. In some such embodiments, the annealing temperature is not more than five hundred degrees Celsius.

The magnetic junction 100/100' is defined from the magnetic junction stack, via step 416. Step 416 includes providing a mask that covers a portion of the magnetic junction stack, then removing the exposed portions of the magnetic junction stack. The magnetic junction 100/100' includes a first pinned layer 110/110' defined from the first pinned layer film, a first nonmagnetic spacer layer 120/120' defined from the first nonmagnetic spacer layer film, a free layer 130/130' defined from the free layer film, a second nonmagnetic spacer layer 140/140' defined from the second nonmagnetic spacer layer film, and a second pinned layer 150/150' defined from the second nonmagnetic spacer layer film.

The first pinned layer magnetization and the second pinned layer magnetization are set, via step 418. Step 418 may be performed by applying a magnetic field in a first direction, for example the direction perpendicular to the magnetic moment 111/111' (e.g. in the positive y direction). The magnetic field is increased in the positive y direction until both magnetic moments 111/111' and 151/151' have components substantially parallel to the field. In some embodiments, the magnetic field may be increased until both magnetic moments 111/111' and 151/151' are parallel to the field. Thus, in FIGS. 2-3, both magnetic moments would be parallel to the positive y direction. In other embodiments, the field is increased until the magnetic moments 111/111' and 151/151' each has a component parallel to the applied field and their projections onto the easy axes of the layers 110/110' and 150/150' are antiparallel. In some embodiments, this portion of step 418 monotonically increases the magnetic field. In some embodiments, the field is at least 0.1 T and may not be more than 1.0 T. The magnetic field is then reduced to zero, via step 420. In some embodiments, the magnetic field is monotonically decreased. As the field is decreased, one of the magnetic moments 111/111' or 151/151' switches direction to be substantially antiparallel to the other magnetic moment (i.e. as shown in FIG. 2 or FIG. 3). This switch may be due to the antiferromagnetic coupling between the pinned layers 110/110' and 150/150'. Stated differently, the magnetic moments 111/111' and 151/151' are allowed to fall into the equilibrium directions such that the substantially antiparallel orientation of the magnetic moment 111/111' and the magnetic moment 151/151' are provided. Thus, the configuration shown in FIGS. 2-3 (pinned layer moments substantially antiparallel and along the easy axes of the pinned layers) may be achieved. If the field were applied in the opposite direction, then the moments 111/111' and 151/151' would start in the negative y-direction. As the field is decreased to zero, the moments 111/111' may then switch direction. Alternatively, the magnetic moment 111/111' may point generally in the negative x-direction, while the moment 151/151" may point in the positive x direction. Thus, the orientations of the pinned layers 110/110' and 150/150' may be set at room or low temperature.

Thus, the magnetic junction 100/100'/100"/200/200'/200" may be fabricated. A magnetic junction and/or the magnetic memory 300 fabricated using the magnetic junction fabricated through the method 410 shares the benefits of the magnetic junctions 100/100'/100"/200/200'/200" and/or the magnetic memory 300. Further, a higher anneal temperature may be used than for the conventional magnetic junction 10. Thus, a higher magnetoresistance may be achieved. In addition, the orientations of the pinned layers 110/110'/110"/210/210'/210" and 150/150'/150"/250/250'/250" are set via magnetic fields in step 416 and 418. Thus, a high field-high temperature anneal may be avoided. As such, specialized annealing furnaces are unnecessary. In addition, the height of the MTJ cell is smaller than conventional MTJ cells. Consequently, performance and manufacturing of the magnetic junctions 100/100'/100"/200/200'/200" and/or the magnetic memory 300 may be improved, especially at smaller technology nodes.

A method and system for providing a magnetic junction and memory fabricated using the magnetic memory junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic memory device comprising:
   a first pinned layer having a first pinned layer magnetic moment and being nonmagnetic layer-free;
   a first nonmagnetic spacer layer;
   a free layer, the first nonmagnetic spacer layer residing between the first pinned layer and the free layer;
   a second nonmagnetic spacer layer, the free layer residing between the first nonmagnetic spacer layer and the second nonmagnetic spacer layer; and
   a second pinned layer having a second pinned layer magnetic moment and being nonmagnetic layer-free, the second nonmagnetic spacer layer residing between the free layer and the second pinned layer, the first pinned layer magnetic moment and the second pinned layer magnetic moment being self-pinned and magnetically coupled;
   wherein the magnetic junction is configured to allow the free layer to be switched between a plurality of stable magnetic states when a write current is passed through the magnetic junction.

2. The magnetic junction of claim 1 wherein the first pinned layer magnetic moment and the second pinned layer magnetic moment are aligned antiparallel.

3. The magnetic junction of claim 2 wherein the first pinned layer magnetic moment and the second pinned layer magnetic moment being magnetically coupled includes an antiferromagnetic coupling.

4. The magnetic junction of claim 2 wherein the first pinned layer magnetic moment and the second pinned layer magnetic moment being magnetically coupled includes a magnetostatic coupling.

5. The magnetic junction of claim 2 wherein the first pinned layer magnetic moment and the second pinned layer magnetic moment are in-plane.

6. The magnetic junction of claim 1 wherein the first pinned layer magnetic moment and the second pinned layer magnetic moment are in-plane.

7. The magnetic junction of claim 1 wherein the first pinned layer magnetic moment and the second pinned layer magnetic moment being magnetically coupled includes an antiferromagnetic coupling.

8. The magnetic junction of claim 1 wherein the first pinned layer magnetic moment and the second pinned layer magnetic moment being magnetically coupled includes a magnetostatic coupling.

9. A magnetic memory comprising:
   a plurality of magnetic storage cells, each of the plurality of magnetic storage cells including at least one selection device and at least one magnetic junction, the at least one magnetic junction including a first pinned layer, a first nonmagnetic spacer layer, a free layer, a second nonmagnetic spacer layer, and a second pinned layer, the first pinned layer having a first pinned layer magnetic moment and being nonmagnetic layer-free, the first nonmagnetic spacer layer residing between the first pinned layer and the free layer, the free layer residing between the first nonmagnetic spacer layer and the second nonmagnetic spacer layer, the second pinned layer having a second pinned layer magnetic moment and being nonmagnetic layer-free, the second nonmagnetic spacer layer residing between the free layer and the second pinned layer, the first pinned layer magnetic moment and the second pinned layer magnetic moment being self-pinned and magnetically coupled, the magnetic junction being configured to allow the free layer to be switched between a plurality of stable magnetic states when a write current is passed through the magnetic junction;
   a plurality of bit lines coupled with the plurality of magnetic storage cells; and
   a plurality of word lines coupled with the plurality of magnetic storage cells.

10. The magnetic memory of claim 9 wherein the first pinned layer magnetic moment and the second pinned layer magnetic moment are aligned antiparallel.

11. The magnetic memory of claim 10 wherein the first pinned layer magnetic moment and the second pinned layer magnetic moment being magnetically coupled includes an antiferromagnetic coupling.

12. The magnetic memory of claim 10 wherein the first pinned layer magnetic moment and the second pinned layer magnetic moment being magnetically coupled includes a magnetostatic coupling.

13. The magnetic memory of claim 10 wherein the first pinned layer magnetic moment and the second pinned layer magnetic moment are in-plane.

14. The magnetic memory of claim 9 wherein the first pinned layer magnetic moment and the second pinned layer magnetic moment are in-plane.

15. The magnetic memory of claim 9 wherein the first pinned layer magnetic moment and the second pinned layer magnetic moment being magnetically coupled includes an antiferromagnetic coupling.

16. The magnetic memory of claim 9 wherein the first pinned layer magnetic moment and the second pinned layer magnetic moment being magnetically coupled includes a magnetostatic coupling.

* * * * *